US011069693B2

(12) United States Patent
Lin et al.

(10) Patent No.: US 11,069,693 B2
(45) Date of Patent: Jul. 20, 2021

(54) METHOD FOR IMPROVING CONTROL GATE UNIFORMITY DURING MANUFACTURE OF PROCESSORS WITH EMBEDDED FLASH MEMORY

(71) Applicant: Taiwan Semiconductor Manufacturing Co., Ltd., Hsinchu (TW)

(72) Inventors: Meng-Han Lin, Hsinchu (TW); Wei Cheng Wu, Zhubei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/545,713

(22) Filed: Aug. 20, 2019

(65) Prior Publication Data

US 2020/0075613 A1  Mar. 5, 2020

Related U.S. Application Data

(60) Provisional application No. 62/723,872, filed on Aug. 28, 2018.

(51) Int. Cl.
| | |
|---|---|
| *H01L 29/423* | (2006.01) |
| *H01L 21/28* | (2006.01) |
| *H01L 27/105* | (2006.01) |
| *H01L 29/66* | (2006.01) |
| *H01L 27/11521* | (2017.01) |
| *H01L 27/11548* | (2017.01) |
| *H01L 27/11526* | (2017.01) |

(52) U.S. Cl.
CPC .. *H01L 27/11521* (2013.01); *H01L 27/11526* (2013.01)

(58) Field of Classification Search
CPC ......... H01L 27/11521; H01L 27/11534; H01L 29/40114
See application file for complete search history.

(56) References Cited

U.S. PATENT DOCUMENTS 9,853,039 B1 * 12/2017 Kang ................. H01L 27/11568
2010/0097854 A1 * 4/2010 Huang ............... G11C 16/3427
365/185.01

(Continued)

FOREIGN PATENT DOCUMENTS

| KR | 10-2008-0015307 A | 2/2008 |
| KR | 10-2018-0060946 A | 6/2018 |

(Continued)

*Primary Examiner* — Brian Turner
(74) *Attorney, Agent, or Firm* — Seed IP Law Group LLP

(57) ABSTRACT

A method is provided for the manufacture of an integrated semiconductor device that includes an embedded flash memory array formed in a recessed region of a semiconductor substrate, the method includes, prior to formation of floating and control gate stacks of the memory array, depositing a protective layer over layers of gate material, and depositing a self-leveling sacrificial layer over the protective layer to produce a substantially planar upper surface. The sacrificial layer is then etched to a depth that removes the sacrificial layer and leaves a substantially planar face on the protective layer. A photo mask is then deposited on the protective layer and the gate stacks are etched from the layers of gate material.

19 Claims, 7 Drawing Sheets

(56) References Cited

U.S. PATENT DOCUMENTS

| | | | |
|---|---|---|---|
| 2010/0176432 A1* | 7/2010 | Ramaswamy | H01L 29/513 257/316 |
| 2010/0276744 A1* | 11/2010 | Lee | H01L 27/11529 257/316 |
| 2014/0117301 A1* | 5/2014 | Lim | H01L 45/128 257/4 |
| 2015/0263010 A1* | 9/2015 | Chuang | H01L 29/66545 257/319 |
| 2015/0348789 A1* | 12/2015 | Liao | H01L 27/11521 438/593 |
| 2016/0307911 A1* | 10/2016 | Wu | H01L 29/40114 |
| 2017/0162590 A1 | 6/2017 | Chuang et al. | |
| 2017/0194322 A1 | 7/2017 | Alexandre | |
| 2018/0006111 A1 | 1/2018 | Xie et al. | |

FOREIGN PATENT DOCUMENTS

| | | |
|---|---|---|
| TW | 201639128 A | 11/2016 |
| TW | 201826502 A | 7/2018 |
| WO | 2006/051090 A1 | 5/2006 |

* cited by examiner

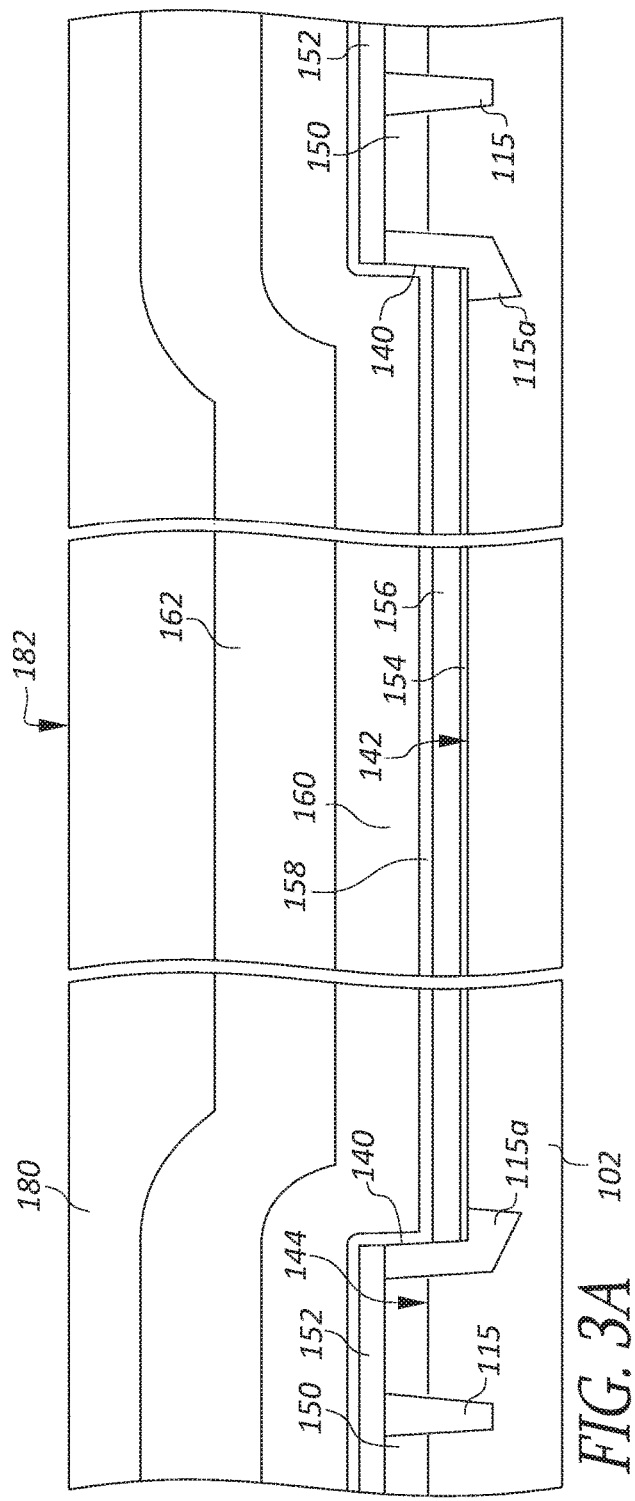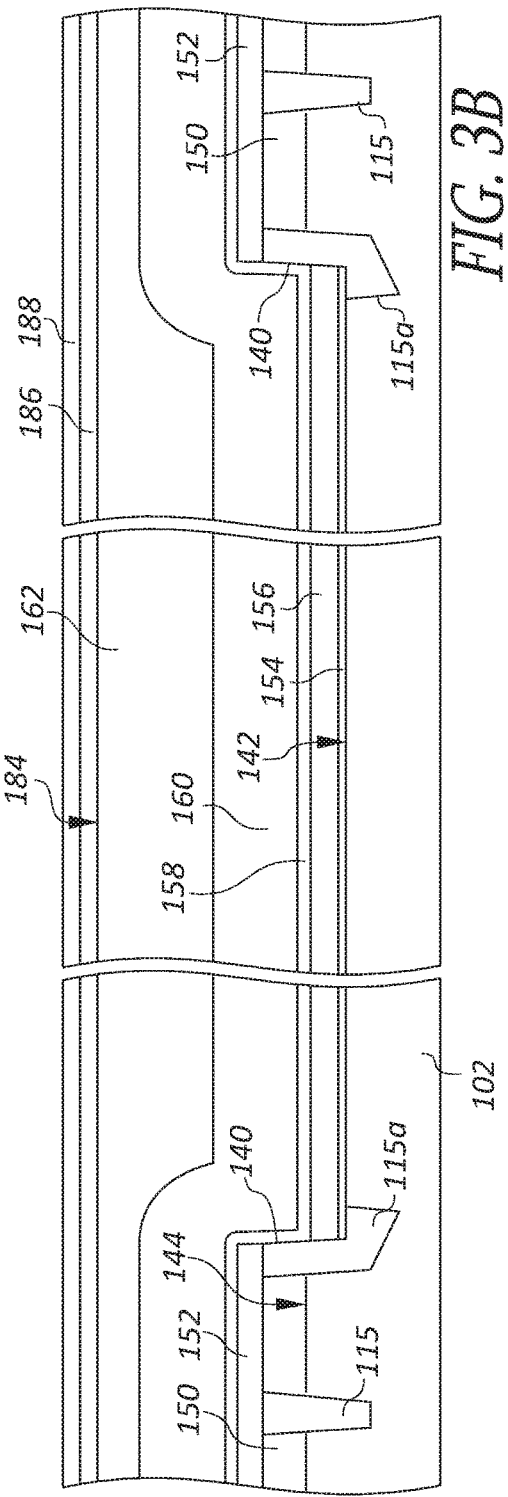

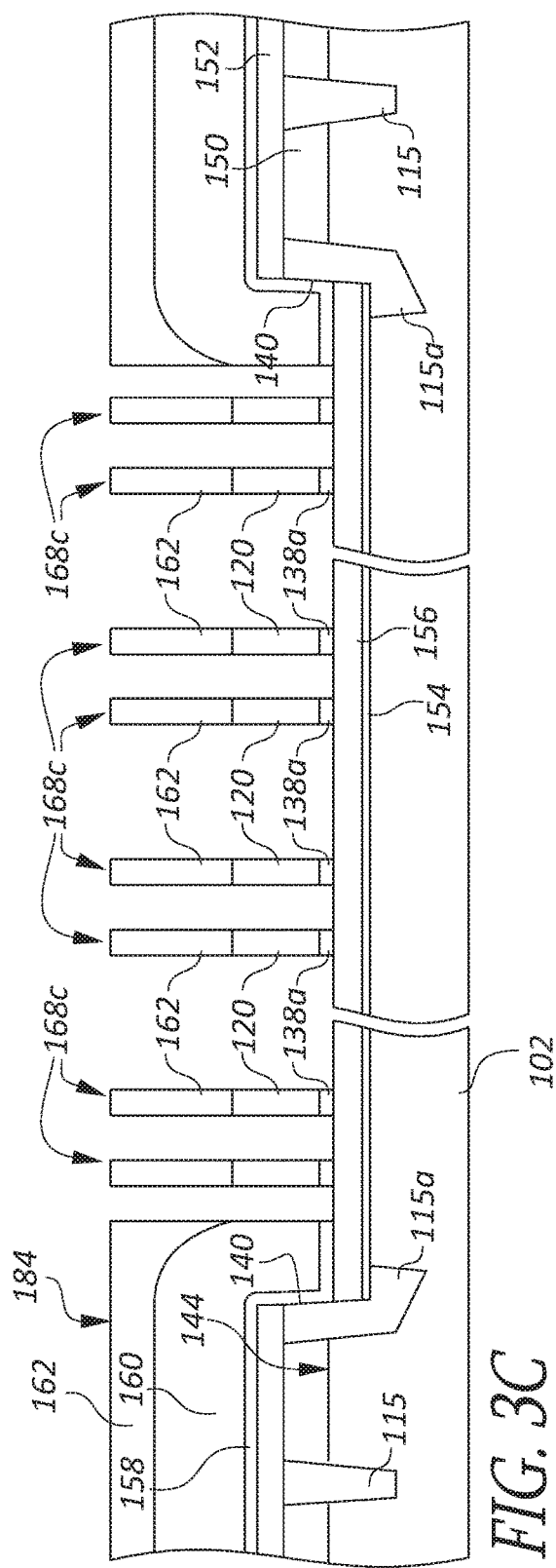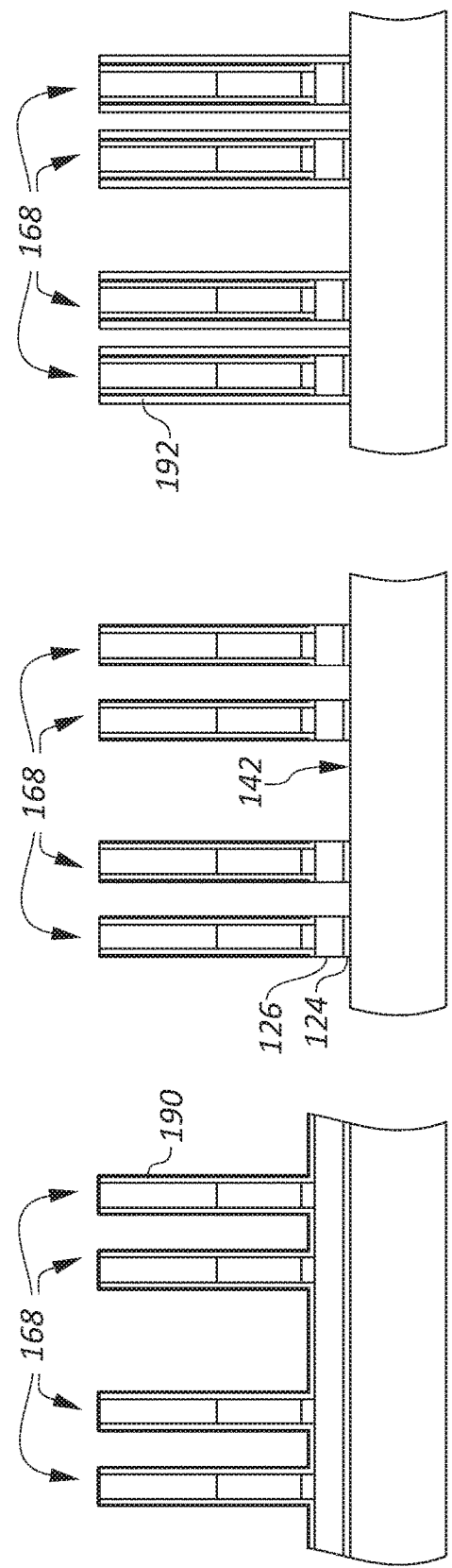

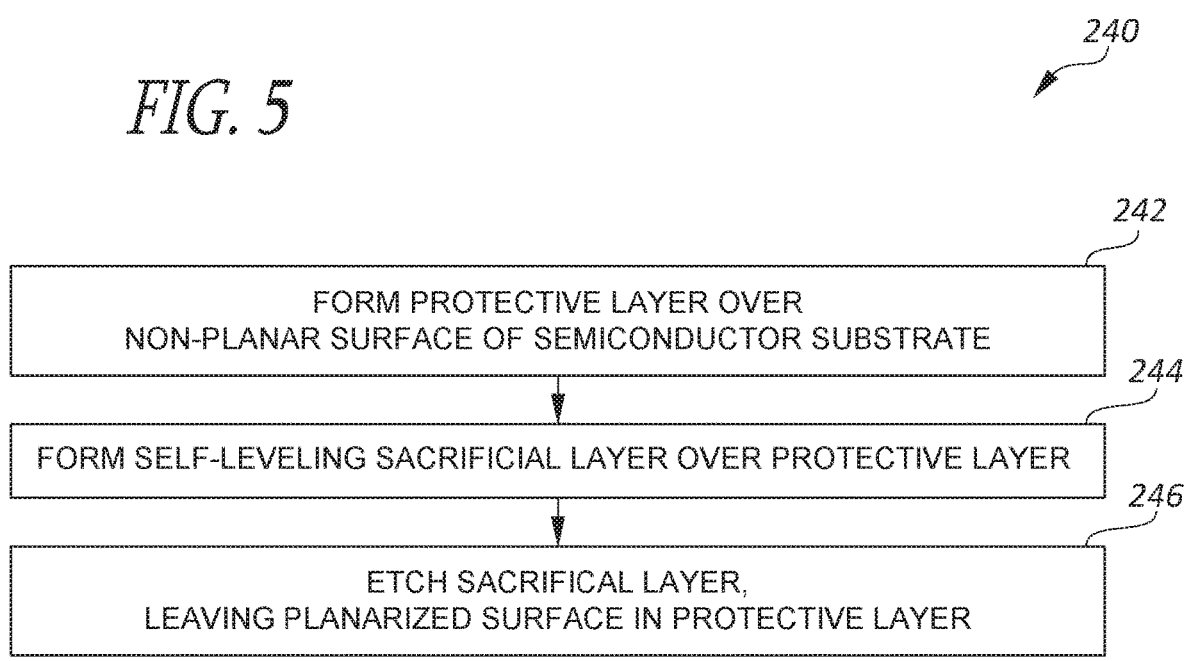

METHOD FOR IMPROVING CONTROL GATE UNIFORMITY DURING MANUFACTURE OF PROCESSORS WITH EMBEDDED FLASH MEMORY

BACKGROUND

Flash memories have some particular advantages and benefits, as compared to other types of solid-state non-volatile memory structures. Many of these advantages and benefits are related, for example, to improved read, write, and/or erase speeds, power consumption, compactness, cost, etc. Flash memories are commonly used in high-density data storage devices configured for use with cameras, cell phones, audio recorders, portable USB data storage devices—often referred to as thumb drives or flash drives— etc. Typically, in such applications, a flash memory is manufactured on a dedicated microchip, which is then coupled with another chip or chips containing the appropriate processor circuits, either together in a single package, or in separate packages configured to be electrically coupled.

Processors with embedded flash memories are a more recent development. In such devices, a flash memory array is manufactured together with logic and control circuitry on a single chip. This arrangement is often used in microcontroller units (MCU), i.e., small computer devices integrated onto single chips, which are typically designed to repeatedly perform a limited number of specific tasks. MCUs are often used in smart cards, wireless communication devices, automobile control units, etc. Integration of memory with related processing circuitry can improve processing speed while reducing package size, power consumption, and cost.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-3F are diagrammatic side sectional views of the semiconductor device of FIG. 1 at respective stages of a manufacturing process, and illustrate the formation of the control and floating gates of the device 100 of FIG. 1, according to an embodiment. In particular, the process of FIGS. 3A-3F continue from the stage described above with reference to FIG. 2B, and supersede the portion of the process described with reference to FIGS. 2C-2D.

FIGS. 4 and 5 are flow chart outlining methods of manufacture, according to respective embodiments, that are consistent with processes described with reference to FIGS. 2A-2B and 3A-3F.

DETAILED DESCRIPTION

Figure 1:
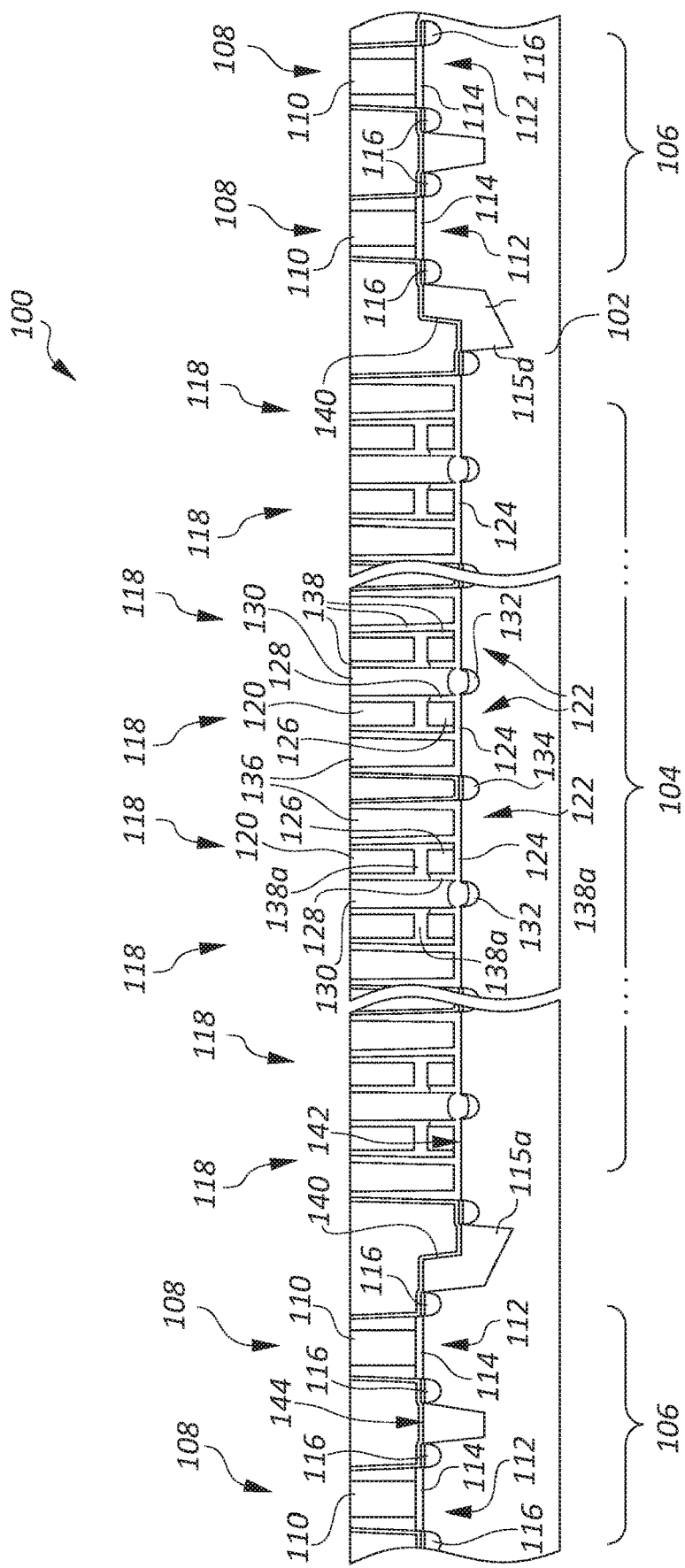
FIG. 1 is a diagrammatic side sectional view of a portion of a semiconductor device with embedded flash memory, such as, e.g., a microcontroller unit, during manufacture, according to an embodiment.

The following disclosure provides various embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the drawings, some elements are designated with a reference number followed by a letter, e.g., "704a, 704b." In such cases, the letter designation is used where it may be useful in the corresponding description to refer to or to differentiate between specific ones of a number of otherwise similar or identical elements. Where the description omits the letter from a reference, and refers to such elements by number only, this can be understood as a general reference to any or all of the elements identified by that reference number, unless other distinguishing language is used.

Reference to a semiconductor substrate can include within its scope any elements that are formed or deposited on a substrate, unless the context clearly limits the scope further. For example, reference to planarizing a surface of a semiconductor substrate can refer to planarizing one or more layers of material deposited or otherwise formed on the actual base material of the substrate, including, for example polysilicon layers, metallic layers, dielectric layers, or a combination of materials, layers, and/or elements.

A microcontroller unit (MCU) typically includes a number of discrete devices, such as, e.g., a central processing unit (CPU) core, static random access memory (SRAM) arrays (or modules), flash memory modules, a system integration module, a timer, an analog-to-digital converter (ADC), communication and networking modules, power management modules, etc. Each of these devices, in turn, comprises a number of passive and active electronic components, such as, e.g., resistors, capacitors, transistors, and diodes. A large number of these components, particularly the active components, are based on various types of metal-oxide semiconductor field effect transistors (MOSFET), or variations thereof. In a MOSFET, conductivity in a channel region extending between source and drain terminals is controlled by an electric field in the channel region, produced by a voltage difference between a control gate and the body of the device.

FIG. 1 is a diagrammatic side sectional view of a portion of a device 100, such as, e.g., an MCU, during manufacture on a semiconductor material substrate 102, according to an embodiment. The device 100 includes a processor with an embedded flash memory array 104 and other processor circuits 106 formed on the semiconductor substrate 102. The other processor circuits 106 include a plurality of transistors 108 configured for a variety of different functions, but which, for the purposes of the present disclosure, will be referred to as logic transistors, each of which includes a control gate 110 isolated from a channel region 112 by a gate dielectric 114. Source and drain regions, 116 are formed at opposite ends of the channel regions 112. Isolation regions 115 electrically isolate various components of the device 100 to prevent interference between different elements during operation.

The flash memory array 104 is positioned within a recessed region 140, and isolated by a shallow trench isolation (STI) region 115a. The memory array 104 includes a plurality of flash memory cells 118 that are, in many respects similar to the logic transistors 108, each having a control gate 120, a channel region 122, and a gate dielectric 124. However, each of the flash memory cells 118 also includes a floating gate 126 positioned between the control gate 120 and the gate dielectric 124. In the embodiment shown, an erase gate dielectric 128 is positioned between each floating gate 126 and a corresponding erase gate 130. Alternating source and drain regions 132, 134 are interleaved between memory cells 118 so that each memory cell shares a source 132 with an adjacent memory cell on one side and a drain 134 with an adjacent memory cell on the opposite side. Select gates 136 are positioned between the drains 134 and the control and floating gates 120, 126 of each memory cell 118. Various layers of material, 138 are shown in general outline, which are not configured to act as conductors or semiconductors in the device 100. These layers may comprise dielectrics, resist overlays, passivation layers, etch stop layers, spacers, etc., and include a dielectric layer 138a positioned between each of the floating gates 126 and the respective control gate 120 of the memory cells 118.

Because of the similarities in the structures of the logic transistors 108 and the flash memory cells 118, they would be of similar heights except for the added height of the floating gates 126 and corresponding dielectric layers 138 of the memory cells. This can be a problem because, at several points during the manufacturing process, chemical/mechanical polishing (CMP) procedures are performed to produce a substantially flattened surface for succeeding process steps. A CMP procedure that reduces the control gates 110 of the logic transistors 108 to the appropriate height can damage the taller control gates 120 of the memory cells 118.

One solution is to form the memory array 102 in a recessed region 140, in which a surface 142 of the semiconductor substrate 102 within the recessed region is reduced in height, relative to a surface 144 of the substrate outside the recessed region, by a distance about equal to the total thickness of the floating gates 126 and the dielectric 138a. This difference in height between the surfaces 142 and 144 may be termed a step height or step height differential between the surface 142 of the recessed region 140 in which memory cells of the memory array 102 are formed and the surface 144 of the periphery around the recessed region in which other components are formed. According to an embodiment, the recessed region 140 is formed via an etching procedure, in which the surface of the semiconductor substrate 102 is etched evenly across the intended recessed region to a desired depth, resulting in a substantially planar surface 142 on which the memory cells 118 are subsequently formed.

According to an alternative embodiment, a layer of semiconductor material is deposited or grown on the surface of the substrate 102 outside the intended recessed region 140, raising the surface 144 to a desired height above the recessed surface 142. For the purposes of the present disclosure, reference to the formation of a recessed region includes any process that results in a defined region having a depth, relative to the surrounding substrate, about equal to the height difference between floating gate transistors and MOSFET transistors that do not employ floating gates.

As noted above, the logic transistors 108 operate by application of an electric field over the respective channel region 112, thereby changing the conductivity of the channel region. The electric field is produced by application of a voltage potential between the control gate 110 and the semiconductor body 102. A MOSFET can be configured either to increase or decrease conductivity when an electric field of a selected polarity is present. Typically, transistors in a logic circuit are designed to function like switches, turning on or off in response to an electric field of a selected strength, and controlling a flow of current in the channel region.

In the memory cells 118, during a write operation, electrons can be forced to tunnel through the gate dielectric 124 to the floating gate 126, where they can remain trapped indefinitely, by applying a write voltage to the control gate 120 while applying a voltage potential across the channel region 122. If there is a sufficient number of electrons trapped on the floating gate 126, the electrons can block an electric field produced by the control gate 120, preventing the control gate from acting to change conductivity in the channel region 122. Thus, the presence of electrons can be detected by applying a voltage potential across the drain and source regions 132, 134 while applying a read voltage to the control gate 120 to produce an electric field, and testing for a current flow in the channel region 122. Typically, a binary value of one is the default setting of a flash memory cell at the time of manufacture and before programming, while a binary value of zero is indicated if channel current is unaffected by a read voltage at the control gate 120. A binary zero value on a flash memory cell can be erased—i.e., returned to a one—by applying a sufficiently powerful erase voltage to the erase gate 130. This causes electrons trapped on the floating gates 126 of the memory cells 118 adjacent to the energized erase gate 130 to tunnel out through the erase gate dielectrics 128 to the erase gate 130. In practice, there are many more memory cells 118 adjacent to the erase gate 130, extending along rows lying perpendicular to the view of FIG. 1. During an erase operation, each of those memory cells is erased, hence the term flash memory.

As advances in technology enable ever smaller and more compact features, power and voltage requirements are reduced while memory density and speed increase. However, a problem that has arisen with the reduction in size is that a very small variation in gate dimensions can have a progressively increasing impact on performance, because such a variation represents a larger change, relative to the proportionately smaller nominal gate dimensions. This becomes a greater issue as technology nodes drop below 65 nm, 40 nm, and 28 nm scales.

FIGS. 2A-2D are diagrammatic side sectional views of the substrate 102 at respective stages of the manufacturing process, showing, in particular, the recessed region 140 during the formation of the control and floating gates 120, 126 of the memory array 108 of the device 100 of FIG. 1. The diagrams shown in FIGS. 2A-2D, and the corresponding description, are only isolated steps in the manufacturing process, and are not intended to provide information regarding the manufacturing process in general.

Figure 2A:
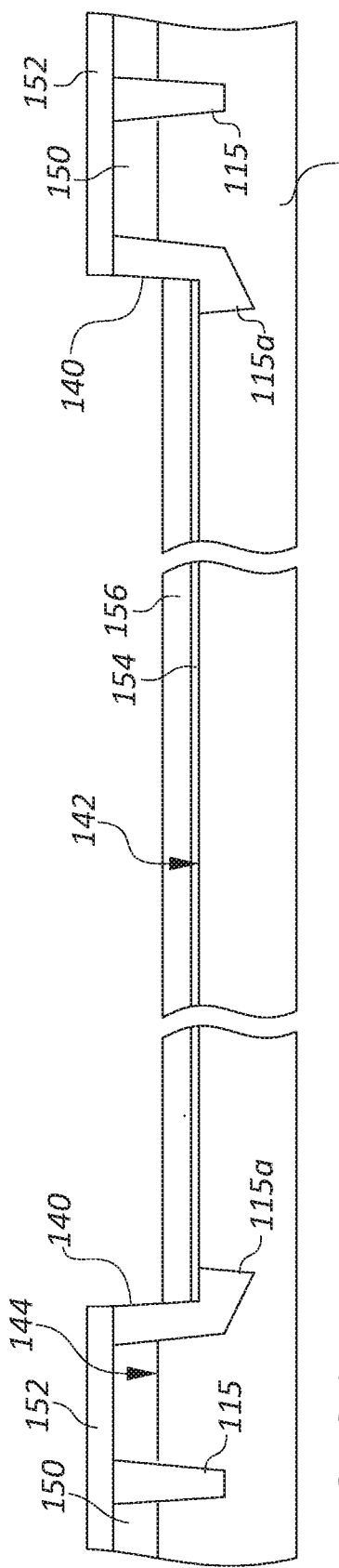
FIGS. 2A-2D are diagrammatic side sectional views of the semiconductor device of FIG. 1 at respective stages of the manufacturing process, showing, in particular, a recessed region during the formation of control and floating gates of an embedded memory array, and illustrate the source of a problem addressed by various disclosed embodiments.

Initially, as shown in FIG. 2A, a protective layer 150 is formed on the surface 144 of the semiconductor material substrate 102, and can include a plurality of layers of, for example, silicon oxide, silicon nitride, etc. Isolation regions 115 are formed in the substrate 102, and a hard mask layer 152 is deposited. The recessed region 140 is then formed in an anisotropic etch process. An oxide layer 154 is formed on the substrate surface 142 within the recessed region 140 and a polysilicon layer 156 is grown over the oxide layer. The oxide and polysilicon layers 154, 156 comprise the materials from which the gate dielectrics 124 and floating gates 126 of the memory array 104 will eventually be formed.

Figure 2B:
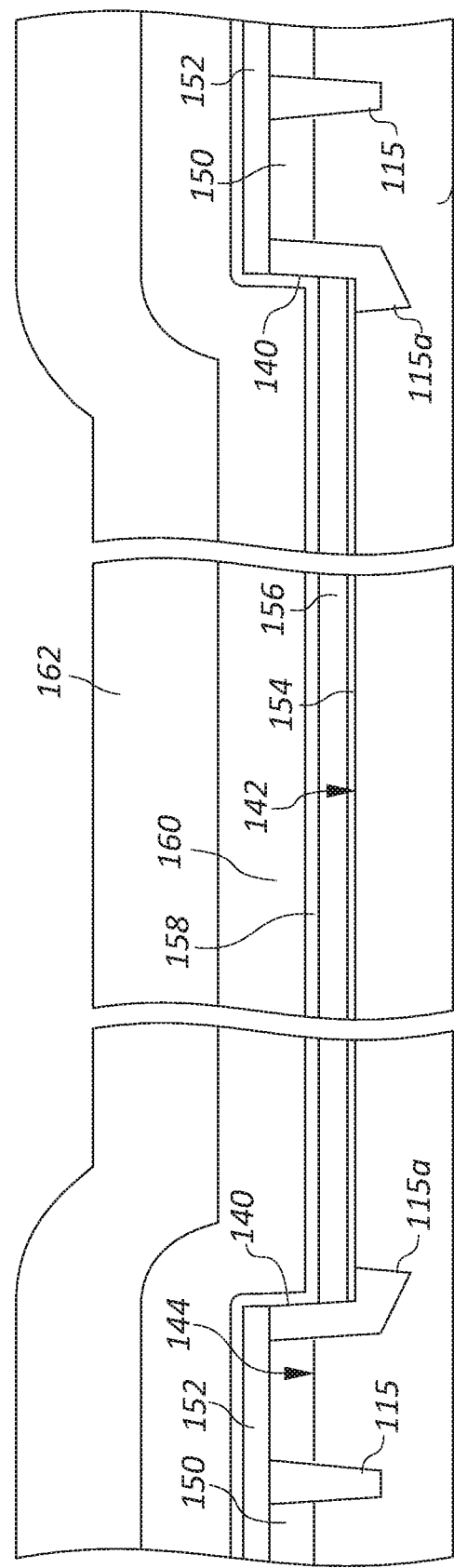

Proceeding to the stage shown in FIG. 2B, a dielectric layer 158 is deposited over the substrate 102, followed by a polysilicon layer 160 and a protective layer 162. The dielectric and polysilicon layers 158, 160 comprise the materials from which the dielectric layers 138a and control gates 120 of the memory array 104 will eventually be formed, while the protective layer 162 will be patterned with the dielectric and polysilicon layers to form protective caps over the gate stacks to protect the control and floating gates during later process steps. According to an embodiment, the protective layer 162 is a hard mask material—typically an oxide, nitride, amorphous carbon, a combination of such materials, etc. The term hard mask material refers to a layer (or layers) of material that is substantially resistant to selected ones of the processes that will be employed following the formation of the mask. The resistance to selected ones of the processes that will be employed following the formation of the mask can be a result of the composition of the hard mask material or a combination of the composition of the hard mask material and the thickness of the hard mask material. The thickness of the hard mask material can vary and embodiments of the present disclosure are not limited to the specific thicknesses described below. In various embodiments, the hard mask material includes a silicon nitride (SiN) layer of 400 angstroms to 500 angstroms (Å), a silicon dioxide (SiO2) layer of 1000 Å to 1200 Å, and a SiN layer of 700 Å to 900 Å. In some embodiments the hard mask material includes a SiN layer of 440 Å, a SiO2 layer of 1100 Å, and a SiN layer of 800 Å. In these embodiments, the total thickness of the hard mask material formed by these layers is 2340 Å which is greater than a depth of the recessed region 140, where the recessed region has a depth of greater than 300 Å. The thickness of these layers is based on an etching electivity of a subsequent etching process described below with reference to FIG. 2D. In various embodiments, the total thickness of the hard mask material formed by these layers ranges from 2100 Å to 2600 Å and is chosen to be greater than a depth of the recessed region 140, where the recessed region has a depth of greater than 300 Å.

Figure 2C:
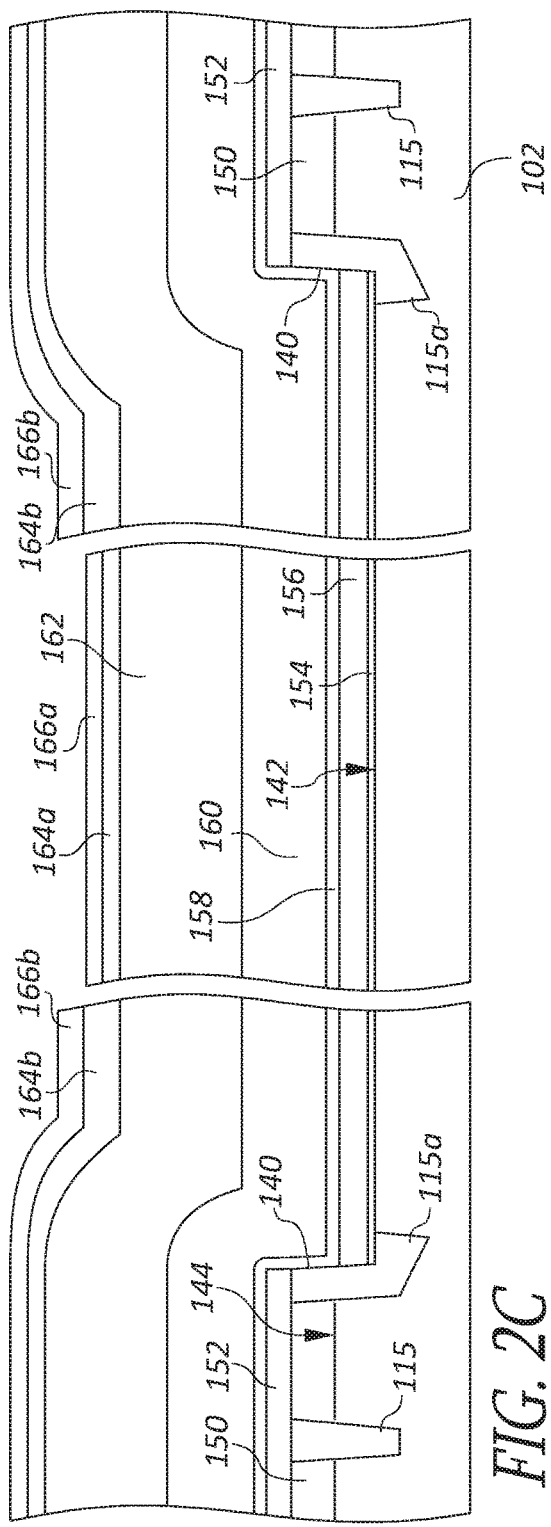

In FIG. 2C, a bottom anti-reflection coating (BARC) 164 is applied over the protective layer 162, followed by a patterning film layer 166. The patterning film layer 166 will be patterned to produce an etch mask, with the BARC 164 positioned between the substrate and the patterning film layer to prevent damage to the film layer caused by reflections from the surface of the substrate 102 during the patterning of the film. The BARC is typically applied via a spin-coating process, while, depending upon the type of patterning film, the patterning film 166 may be applied via any of several processes, including, for example, deposition processes such as thermal deposition or chemical vapor deposition (CVD). As shown in FIG. 2C, the BARC 164 tends to deposit more thickly around the edges (164b) of the recessed region 140 than in the center (164a). If the patterning film is applied by spin-coating, it too will likely be thicker at the edges (166b) than in the middle of the recessed region (166a).

Figure 2D:
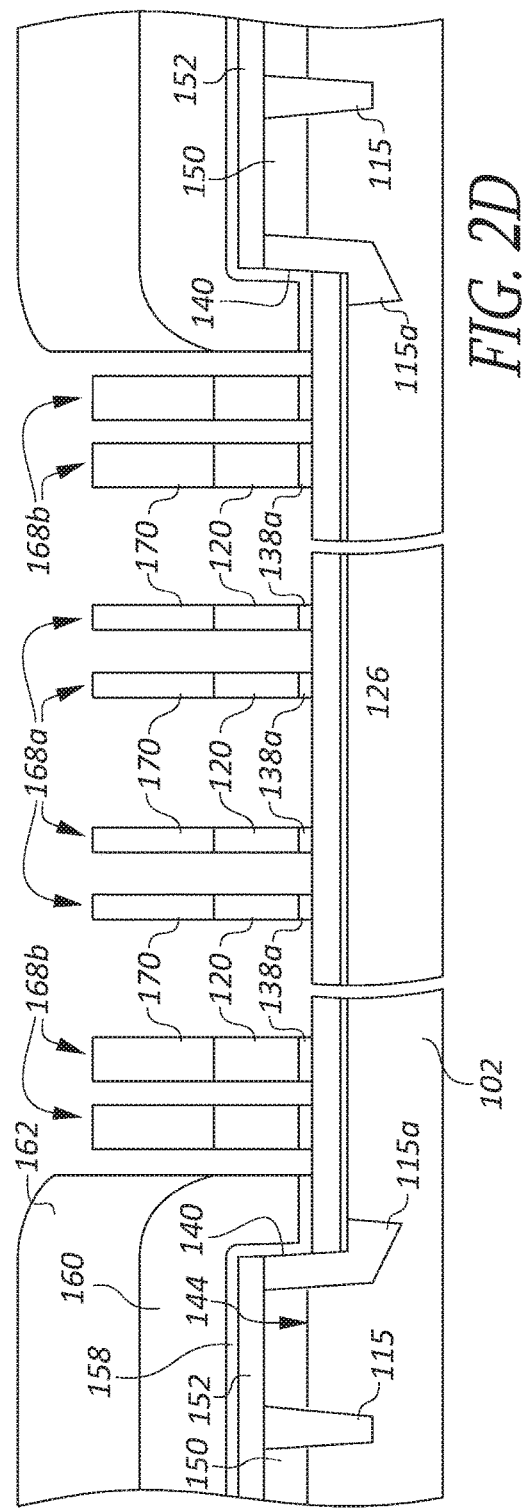

Turning finally to FIG. 2D, after patterning of the patterning film layer 166, an etching process is performed, producing a plurality of gate stacks 168, each having a protective cap 170, a control gate 120, and a dielectric layer 138a. Remnants of the oxide layer 158, the polysilicon layer 160, and the protective layer 162 remain around the periphery of the recessed region 140. The gate dielectrics 124 and floating gates 126 will be etched from their parent layers 154, 156 during a later step, after additional process steps are performed, including the deposition of further dielectric layers.

As shown in FIG. 2D, the gate stacks 168a near the center of the recessed region 140 are narrower than the gate stacks 168b closer to the edges of the region. This is caused by the thicker BARC and patterning film layer portions 164b near the edges of the recessed region 140, as described above with reference to FIG. 2C. Typically, BARC material is considered to be conformal, and the impact of small variations in thickness caused by surface features of the substrate has been negligible. As scales continue to drop, the impact of small variations in thickness caused by surface features of the substrate may become a significant problem, particularly at technology nodes below, e.g., the 65 nm, 40 nm, and 28 nm scales. This is because the dimensions of the control and floating gates 120, 126 have a direct impact on critical operating characteristics of the devices, such as read and write speeds, program and erase state voltage and current, and power consumption, etc.

In order to utilize the memory cells 118 near the edges of the recessed region 140, the operating parameters of the entire memory array 108 can be modified, to ensure that data is not lost or corrupted because the memory cells near the edges of the recessed region are not properly written or erased. Modifying the operating parameters of the entire memory cell in this manner can result in less than optimal performance of the entire array. One alternative is to leave the cells nearest the edges of the recessed region 140 inactive—or leave the edge region empty—but this will result in a loss of capacity. The reduced total capacity may be minimal if all of the memory cells of a device are in a single array, but many MCU devices are designed to place smaller memory arrays adjacent to circuits that will be using them, to increase throughput speed. In such devices, smaller memory arrays are positioned at multiple locations on the device. Consequently, the total area of the edge regions is much larger than in a single array, so the lost capacity is also much greater.

The inventors have also recognized that the problem could be eliminated if the BARC were deposited on a substantially planar surface. However, planarizing the surface at the process stage shown in FIG. 2B is problematic. A CMP process would have a tendency to produce dishing over the recessed region 140, and other planarizing processes are inapplicable or would require many additional process steps.

Embodiments described hereafter with reference to FIGS. 3A-3F reduce or eliminate the BARC layer thickness variations and the associated variation in gate uniformity described above. FIGS. 3A-3F are diagrammatic side sectional views of the substrate 106 at respective stages of a manufacturing process, according to an embodiment, showing formation of the control and floating gates 120, 126 of the memory array 108 of the device 100 of FIG. 1. In particular, the process of FIGS. 3A-3F continue from the stage described above with reference to FIG. 2B, and replace the portion of the process described with reference to FIGS. 2C-2D. Thus, proceeding from the stage of FIG. 2B, FIG. 3A shows the deposition of a sacrificial layer 180 over the protective layer 162. According to embodiments of the present disclosure, the sacrificial layer 180 is a photoresist layer that is applied in a spin coating process, with a thickness that is sufficient to completely fill the depression in the protective layer 162 over the recessed region 140. The sacrificial layer 180 is self-leveling, meaning that, as applied, its upper surface 182 is substantially planar, without requiring further processing. A thickness of the sacrificial layer 180 is about 1000 Å per spin-coating process in one embodiment of the present disclosure. The thickness of the sacrificial layer 180 is not limited to being about 1000 Å per spin-coating process and can be greater or less than 1000 Å per spin-coating process. The sacrificial layer 180 is not limited to being a photoresist layer, and may be other flowable materials in further embodiments of the present disclosure. In addition, the flowable material of the sacrificial layer 180 is not limited to being applied through a spin coating process, with other suitable processes being utilized to apply the flowable material in further embodiments.

As shown in FIG. 3B, a non-selective etch process is performed, etching the surface of the substrate back into the protective layer 162, while completely removing the sacrificial layer 180. The chemistry of the etching process is selected such that the etch rates of the sacrificial layer 180 and of the protective layer 162 are substantially equal. Consequently, the etching process proceeds evenly across the surface of the substrate, leaving a planarized face 184 on the surface of the protective layer 162. A patterning film layer 186 and a BARC layer 188 are then deposited at uniform thicknesses over the planarized surface 184 of the protective layer 162. The BARC layer 188 is typically a suitable flowable material and is formed through a spin-coating process while the patterning film layer 186 is formed through a suitable process such as a chemical vapor deposition (CVD) process, as discussed above for corresponding layers in relation to FIGS. 2A-2D. The upper surface 182 is said to be substantially planar in embodiments of the present disclosure, where the term "substantially" indicates the upper surface is sufficiently planar to enable the subsequent formation of the patterning film layer 186 and BARC layer 188 having reduced thickness variations to thereby enable the formation of control gates having uniform thicknesses as described above.

Other processes may be utilized to remove the sacrificial layer 180 and to partially remove the protective layer 162. The portion of the protective layer 162 remaining after the etching of the surface of the substrate to remove the sacrificial layer 180 and partially remove the protective layer depends on the specific etching process utilized. In one embodiment, the etching process partially removes the protective layer 162 to leave a remaining portion of the protective layer having a depth of 1500-2000 angstroms. The described embodiments of the present disclosure, which apply the sacrificial layer 180 through spin coating and remove the sacrificial layer and partially remove the protective layer, improve the uniformity of the BARC layer 188 deposited across the center and periphery portions of the flash memory array 104 (FIG. 1). This uniformity of the BARC layer 188 enables the formation of gate stacks 168c (FIG. 3C) having uniform thicknesses for the gate stacks in the center and in the periphery portions of the flash memory array 104.

According to an embodiment, the etch of the sacrificial layer 180 proceeds directly following the deposition and—if necessary—planarizing of the sacrificial layer, without any intervening process steps. According to another embodiment, one or more process steps are performed between the deposition of the sacrificial layer 180 and its subsequent removal in the etch procedure. These intervening process steps can include processes that are unrelated to the formation of the memory array 104.

Proceeding to FIG. 3C, the patterning film layer 188 is patterned to form an etch mask, and the protective, polysilicon and dielectric layers 162, 160, 158 are etched to form gate stacks 168c. In contrast with the gate stacks 168a and 168b of FIG. 2D, the gate stacks 168c of FIG. 3C are substantially equal in width, owing to the uniform thickness of the BARC layer 188 and the patterning film layer 186, which, in turn, is due to the planarized face of 184 of the protective layer 162.

FIGS. 3D-3E are diagrammatic side sectional views of the substrate 106, showing a small portion of the recessed region 140, and illustrating the manufacturing process through a stage in which the gate stacks 168 of the memory array are substantially complete. In FIG. 3D, one or more dielectric layers 190 are deposited over the gate stacks 168. In FIG. 3E, the floating gates 126 and gate dielectrics 124 are formed in an etching process in which the gate stacks 168 act as self-aligned masks. Finally, in FIG. 3F, an oxide is formed over the gate stacks 168 and etched to leave protective dielectric layers 192 on the sides of the gate stacks.

Figure 4:
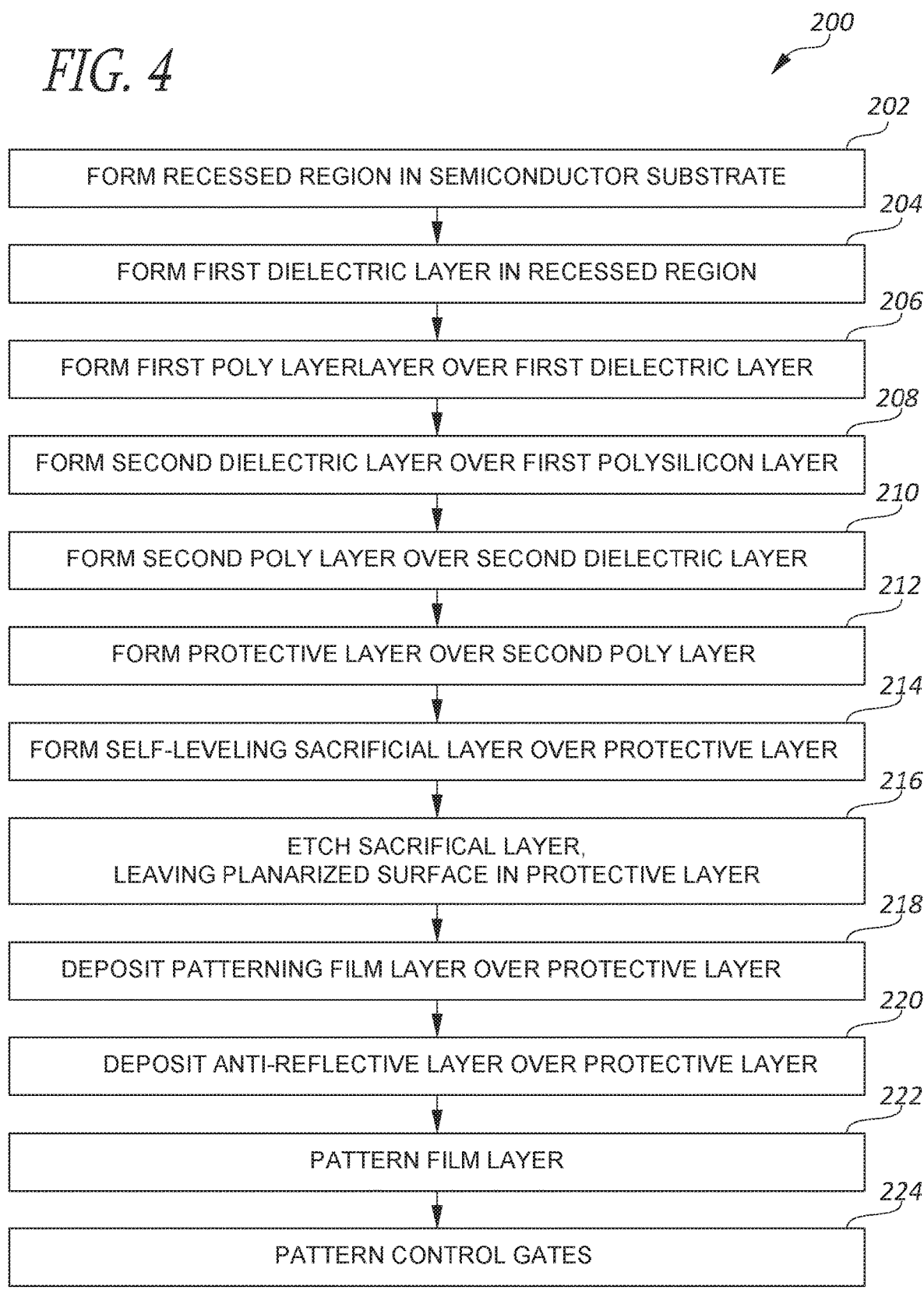

FIGS. 4 and 5 are flow chart outlining methods of manufacture, according to respective embodiments, that are consistent with processes described above with reference to FIGS. 2A-2B and 3A-3F.

FIG. 4 outlines a method 200, according to an embodiment, in which, at step 202, the recessed region 140 is formed in the semiconductor substrate 102. The first dielectric layer 154 is formed over the substrate 102 within the recessed region 140 in step 204, and the first polysilicon layer 156 is formed over the first dielectric layer 154 in step 206. In step 208, the second dielectric layer 158 is formed, followed by formation of the second polysilicon layer 160 in step 210. In step 212, the protective layer 162 is formed over the second polysilicon layer 160. In step 214, the sacrificial layer 180 is formed over the protective layer 162, self-leveling to form the planar upper surface 182. In step 216, in a non-selective etch process the sacrificial layer 180 is removed, together with a portion of the protective layer 162, planarizing the exposed surface 184 of the protective layer. The patterning film layer 186 is deposited on the surface 184 of the protective layer 162 and the anti-reflective coating 188 is deposited over the substrate, in respective steps 218 and 220, and the patterned film layer 186 is patterned in step 222. Finally, a plurality of control gates 120 are defined in an etch process regulated by the patterned film layer, in step 224.

FIG. 5 is a flow chart outlining a method 240 for providing a planarized surface in a manufacturing process, according to another embodiment. In step 242, the protective layer 162 is deposited over a non-planar surface on the semiconductor substrate 102. In step 244, the self-leveling sacrificial layer 180 is formed over the protective layer 162, forming a planar upper surface 182. In step 246, a non-selective etch procedure is performed in which the entirety of the sacrificial layer 180 and a portion of the protective layer 162 are removed to leave a planarized surface 184 of the remaining portion of the protective layer 162.

The embodiments shown and described herein provide improvements to a process for manufacturing microelectronic devices that include embedded flash memory arrays. According to various embodiments, prior to defining control and floating gate stacks of the memory arrays in recessed regions on a semiconductor substrate, a planar surface is provided on the substrate over layers of material from which the gate stacks are to be formed, for deposition of an anti-reflective coating and of a patterning film at an even thickness. This is beneficial because the anti-reflective coating, in particular, has a tendency to vary in thickness when it is deposited over a non-planar surface, which in turn, can contribute to non-uniformity of control and floating gate dimensions. The dimensions of the control and floating gates have a direct impact on critical operating characteristics of a memory device, such as read, write, and erase speeds, program and erase state voltage and current levels, power consumption, etc. If gate dimensions vary within a memory array, a typical practice is to operate the entire array based on the operating characteristics of the weakest cells. Thus, significant variation in dimensions is a problem because, if even a small percentage of the cells in an array require higher voltages and/or longer read and write times, the entire array is operated at the same levels, resulting in a loss of efficiency and speed for the entire array. By providing the planar surface, non-uniformity in gate dimensions of the memory arrays is reduced or eliminated. This, in turn, results in arrays with higher overall speed and efficiency.

According to an embodiment, the improvements include forming a protective layer over a non-planar surface of a semiconductor substrate, in particular, for example, over a recessed region of the semiconductor substrate, in which an embedded memory array is to be formed. A sacrificial layer is then deposited over the protective layer, to a depth sufficient to permit formation of a substantially planar surface on the sacrificial layer. The sacrificial layer is then etched to a depth that removes the sacrificial layer and leaves a planar surface formed in the protective layer.

According to another embodiment, the method includes forming a recessed region in a semiconductor substrate, and forming gate materials for a plurality of floating gates and control gates of a memory array, in layers over the recessed region. A protective layer is then formed over the gate materials in the recessed region, and planarized to improve uniformity of gate dimensions. An etch mask is formed over the planarized protective layer, and gate stacks of the memory array are formed in the recessed region, by etching the gate materials. According to an embodiment, planarizing the protective layer includes depositing a self-leveling sacrificial layer over the protective layer to produce a substantially planar surface, then etching the surface at an even rate, and to a depth sufficient to remove the sacrificial layer, which results in a planar surface on the protective layer.

According to another embodiment, the method includes forming a protective layer over a stack of gate-material layers in a recessed region of a semiconductor substrate. A self-leveling sacrificial layer is then deposited over the protective layer to a depth sufficient to produce a planarized surface of the semiconductor substrate, and the sacrificial layer is etched back at an even rate to a depth sufficient to produce a substantially planar surface on the protective layer.

Ordinal numbers, e.g., first, second, third, etc., are used in the claims according to conventional claim practice, i.e., for the purpose of clearly distinguishing between claimed elements or features thereof, etc. Ordinal numbers may be assigned arbitrarily, or assigned simply in the order in which elements are introduced. The use of such numbers does not suggest any other relationship, such as order of operation, relative position of such elements, etc. Furthermore, an ordinal number used to refer to an element in a claim should not be assumed to correlate to a number used in the specification to refer to an element of a disclosed embodiment on which that claim reads, nor to numbers used in unrelated claims to designate similar elements or features.

While the method and process steps recited in the claims may be presented in an order that corresponds to an order of steps disclosed and described in the specification, except where explicitly indicated, the order in which steps are presented in the specification or claims is not limiting with respect to the order in which the steps may be executed.

The abstract of the present disclosure is provided as a brief outline of some of the principles of the invention according to one embodiment, and is not intended as a complete or definitive description of any embodiment thereof, nor should it be relied upon to define terms used in the specification or claims. The abstract does not limit the scope of the claims.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a recessed region in a semiconductor substrate;
   forming gate materials for a plurality of floating gates and control gates of a memory array in layers over the recessed region;
   forming a protective layer over the gate materials in the recessed region;
   planarizing the protective layer by:
      depositing a sacrificial layer over the protective layer;
      planarizing the sacrificial layer; and
      after planarizing the sacrificial layer, etching the planarized surface of the sacrificial layer at an even rate across the recessed region, to a depth sufficient to leave a planarized surface on the protective layer:,
   forming an etch mask layer over the planarized protective layer; and
   forming a plurality of gate stacks in the recessed region by etching the gate materials.

2. The method of claim 1, wherein the etching the planarized surface of the sacrificial layer to a depth sufficient to leave a planarized surface on the protective layer comprises etching the planarized surface of the sacrificial layer to a depth sufficient to entirely remove the sacrificial layer.

3. The method of claim 1, wherein the depositing a sacrificial layer over the protective layer and the planarizing the sacrificial layer together comprise depositing, over the protective layer, a self-leveling sacrificial layer.

4. The method of claim 3 wherein the depositing, over the protective layer, a self-leveling sacrificial layer comprises using a spin-coating process to deposit a self-leveling sacrificial layer.

5. The method of claim 1, wherein the etching the planarized surface of the sacrificial layer comprises etching the planarized surface of the sacrificial layer directly following the depositing and planarizing the sacrificial layer, with no intervening process steps.

6. The method of claim 1, wherein the forming an etch mask layer over the planarized protective layer comprises:
   forming an anti-reflective coating layer over the planarized protective layer and
   forming an etch mask layer over the anti-reflective coating layer.

7. The method of claim 1, wherein the forming gate materials for a plurality of floating gates and control gates comprises:
   depositing a gate dielectric layer over the recessed region;
   depositing a first polysilicon layer over the gate dielectric layer;
   depositing an inter-gate dielectric layer over the first polysilicon layer; and
   depositing a second polysilicon layer over the inter-gate dielectric layer.

8. The method of claim 7, wherein the forming a plurality of gate stacks in the recessed region comprises:
   providing the etch mask layer with a pattern corresponding to a gate pattern; and
   etching the inter-gate dielectric layer and the second polysilicon layer using the patterned etch mask layer.

9. A method, comprising:
   forming a protective layer over a stack of gate-material layers in a recessed region of a semiconductor substrate;
   depositing a sacrificial layer over the protective layer
   planarizing the sacrificial layer; and
   after planarizing the sacrificial layer, etching the planarized surface of the sacrificial layer at an even rate across the recessed region, to a depth sufficient to leave a planarized surface on the protective layer.

10. The method of claim 9 wherein the forming a protective layer comprises forming a protective layer that includes one or more of amorphous carbon, an oxide and a nitride.

11. The method of claim 9 wherein the depositing a sacrificial layer comprises spin-coating a layer of photo resist material onto the semiconductor substrate.

12. The method of claim 9 wherein the forming, over a stack of gate-material layers in a recessed region of a semiconductor substrate, a protective layer comprises forming a protective layer over a stack of gate-material layers that includes a first dielectric layer, a first polysilicon layer, a second dielectric layer, and a second polysilicon layer.

13. The method of claim 9, further comprising, following the removing the sacrificial layer, forming a plurality of gate stacks from the stack of gate material layers and the protective layer.

14. The method of claim 13, wherein the forming a plurality of gate stacks comprises:
   providing an etch mask layer with a pattern corresponding to a gate pattern; and
   etching the second dielectric layer and the second polysilicon layer using the etch mask layer.

15. A method, comprising:
   forming a protective layer over a non-planar surface of a semiconductor substrate;
   depositing a sacrificial layer over the protective layer;
   forming a first planarized surface on the sacrificial layer by planarzing the sacrificial layer; and
   afte planarizing the sacrificial layer, forming, a second planarized surface on the protective layer by etching the first planarized surface of the sacrificial layer at an even rate across a recessed region underlying the protective layer to a depth sufficient to remove the sacrificial layer and to remove a portion of the protective layer.

16. The method of claim 15 wherein etching the surface of the sacrificial layer comprises etching the surface of the sacrificial layer to completely remove the sacrificial layer and to partially remove the protective layer.

17. The method of claim 15, comprising:
   prior to the forming the protective layer, forming, in layers over the recessed region, materials for a plurality of floating gates and control gates of a memory array.

18. The method of claim 17, wherein the forming, in layers over the recessed region, materials for the plurality of floating gates comprises:
   forming a first dielectric layer over the semiconductor substrate;
   forming a first polysilicon layer over the first dielectric layer;
   forming a second dielectric layer over the first dielectric layer; and
   forming a second polysilicon layer over the second dielectric layer.

19. The method of claim 18, further comprising forming a plurality of gate stacks in the recessed region by:
   providing a patterned etch mask layer with a pattern corresponding to a gate pattern; and
   etching the second dielectric layer and the second polysilicon layer using the patterned etch mask layer.

* * * * *

UNITED STATES PATENT AND TRADEMARK OFFICE
CERTIFICATE OF CORRECTION

PATENT NO. : 11,069,693 B2
APPLICATION NO. : 16/545713
DATED : July 20, 2021
INVENTOR(S) : Meng-Han Lin et al.

It is certified that error appears in the above-identified patent and that said Letters Patent is hereby corrected as shown below:

In the Claims

Column 12, Claim 15, Lines 16-17:
"by planar zing the sacrificial layer; and afte planarizing the sacrificial layer, forming, a second"
Should read:
--by planarizing the sacrificial layers; and after planarizing the sacrificial layers, forming a second--.

Signed and Sealed this
Twelfth Day of July, 2022

Katherine Kelly Vidal
*Director of the United States Patent and Trademark Office*